(12) United States Patent
Beyer et al.

(10) Patent No.: US 8,537,556 B2
(45) Date of Patent: Sep. 17, 2013

(54) HOLDING APPARATUS

(75) Inventors: Bernd Beyer, Langensendelbach (DE); Horst Friesner, Altendorf (DE); Markus Hemmerlein, Neunkirchen/Br. (DE); Florian Hofmann, Erlangen (DE); Helmut Repp, Erlangen (DE); Wolfgang Schnitzerlein, Kirchehrenbach (DE); Markus Stark, Waizendorf (DE); Peter Tichy, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 331 days.

(21) Appl. No.: 12/418,880

(22) Filed: Apr. 6, 2009

(65) Prior Publication Data

US 2009/0257206 A1 Oct. 15, 2009

(30) Foreign Application Priority Data

Apr. 11, 2008 (DE) .......................... 10 2008 018 386

(51) Int. Cl.
*H05K 1/14* (2006.01)
*H05K 5/00* (2006.01)
*H05K 7/10* (2006.01)
*H05K 7/14* (2006.01)
*H05K 1/11* (2006.01)
*H05K 7/02* (2006.01)

(52) U.S. Cl.
USPC ........... 361/727; 361/742; 361/758; 361/759; 361/770; 361/801; 361/804; 361/807; 361/810

(58) Field of Classification Search
USPC .............. 361/807, 810, 728–729, 752–753, 361/758–759, 801, 804, 742, 770, 679.01–679.45, 361/679.55–679.59; 174/162, 252, 260–261; 248/223.41, 223.31, 222.11; 220/788, 345.1, 220/254.9; 211/41.17; 312/223.1, 223.2
See application file for complete search history.

(56) References Cited

U.S. PATENT DOCUMENTS 4,821,149 A 4/1989 Belanger, Jr.
4,903,167 A * 2/1990 Lichtensperger ............. 361/740
(Continued)

FOREIGN PATENT DOCUMENTS

| CN | 2672904 Y | 1/2005 |
| CN | 1697599 A | 11/2005 |
| DE | 6803165 U | 2/1969 |
| DE | 33 35 820 C2 | 8/1988 |
| DE | 100 57 460 C1 | 8/2002 |

OTHER PUBLICATIONS

German Office Action dated Mar. 11, 2011 for corresponding German Patent Application No. DE 10 2008 018 386.5-34 with English translation.
Chinese Office Action dated Apr. 12, 2013 for corresponding Chinese Patent Application No. CN 200910132032.6 with English translation.

*Primary Examiner* — Jayprakash N Gandhi
*Assistant Examiner* — Nidhi Desai
(74) *Attorney, Agent, or Firm* — Lempia Summerfield Katz LLC

(57) ABSTRACT

The invention specifies a holding apparatus comprising a support element and a circuit board. A trench for receiving the circuit board is embodied in the support element. At least one first clamping element is arranged on one or both longitudinal sides of the circuit board and/or at least one second clamping element is arranged in the trench. As a result, the circuit board received by the trench is fixed in the trench in a clearance-free fashion.

10 Claims, 4 Drawing Sheets

(56) References Cited

U.S. PATENT DOCUMENTS

| | | | |
|---|---|---|---|
| 6,418,028 B2 * | 7/2002 | Nariyama | 361/759 |
| 6,836,411 B2 * | 12/2004 | Slowig et al. | 361/752 |
| 7,040,905 B1 * | 5/2006 | Wang | 439/76.1 |
| 2001/0027876 A1 * | 10/2001 | Tsukamoto et al. | 174/260 |
| 2007/0127225 A1 * | 6/2007 | Slaton | 361/807 |
| 2008/0304244 A1 * | 12/2008 | Hsieh | 361/810 |
| 2010/0039780 A1 * | 2/2010 | Wendt et al. | 361/752 |

* cited by examiner

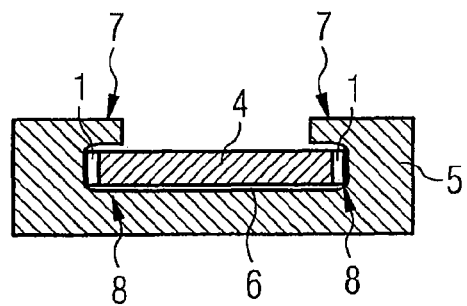
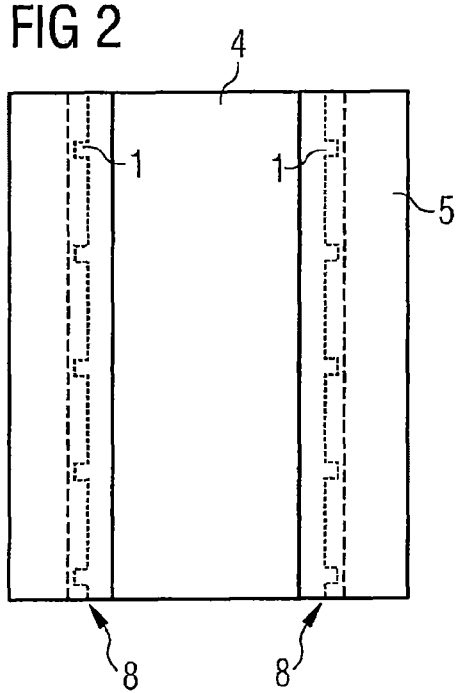
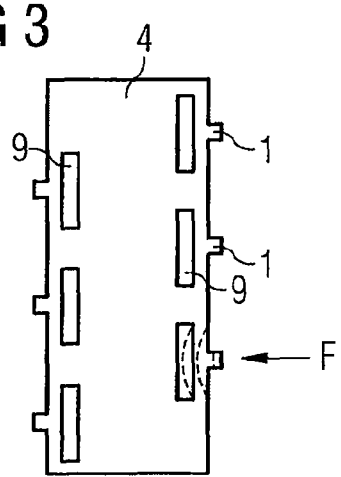

HOLDING APPARATUS

This patent document claims the benefit of DE 10 2008 018 386.5, filed Apr. 11, 2008, which is hereby incorporated by reference.

BACKGROUND

The present embodiments relate to a holding apparatus for fixing a circuit board onto a support element in a clearance-free fashion.

When constructing electrical and electronic devices, printed circuit boards are generally arranged and fixed in or on a housing of the electrical or electronic devices. Long, extended circuit boards are fixed to the lateral surface of a cylinder or to the inner surface of a hollow cylinder. Circuit boards with lengths of more than two meters must be fixed to the interior and/or exterior of rings with a diameter of greater than 1.6 m, for example, for the contactless signal transmission in the field of computed tomography. The circuit boards are usually bonded to the ring and/or screwed thereon.

SUMMARY AND DESCRIPTION

The present embodiments may obviate one or more of the drawbacks or limitations inherent in the related art. For example, in one embodiment, an additional holding apparatus for circuit boards is provided. The holding apparatus may be used to mount long circuit boards in a simple and rapid clearance-free fashion. Centrifugal forces may be absorbed. The circuit boards may be easily exchanged and different thermal expansion coefficients and tolerances may be compensated for and the signal transmission properties are not negatively influenced.

In one embodiment, a holding apparatus includes a support element and a circuit board. A trench for receiving the circuit board is embodied in the support element. At least a first clamping element is arranged on one or both longitudinal sides of the circuit board and/or at least one second clamping element is arranged in the trench, so that the circuit board received by the trench is fixed therein in a clearance-free fashion.

Accordingly, long and/or broad circuit boards may be easily and quickly mounted and dismounted. With a two-sided, symmetrical clamping, a central alignment of the circuit board is ensured irrespective of tolerances. Length differences, as a result of temperature influences and different heat expansion coefficients of the used materials, may be compensated for with the holding apparatus. With an application in data transmission systems, there are no negative effects on the data transmission properties as a result of the clamping elements. The circuit board may be fixed to both flat as well as curved support elements.

The longitudinal sides and/or side walls of the trench may include the at least one second clamping element. The trench may alternatively be formed by lateral limiting elements. This allows simple production.

In a further embodiment, the longitudinal sides of the trench may be arranged in parallel. A parallel guidance of the circuit board is ensured as a result.

The second clamping element may be formed by an elastically or plastically deformable tapering of the trench and/or a bevel on at least one of the longitudinal sides. The advantage here is that a circuit board may be easily introduced into the trench.

The tapering may be embodied as a lug or snap-fit hook. Accordingly, a more reliable, but nevertheless easily producible fixing of the circuit board may be achieved.

A groove may be embodied in at least one side wall of the trench. The circuit board may be inserted in the groove. Accordingly, the circuit board may be grasped in a stable fashion.

At least one second clamping element may be arranged and embodied on the surface area of the trench such that the circuit board can be curved in the transverse direction of the trench. The curve produces a voltage in the circuit board and the circuit board is fixed in the trench.

At least one first clamping element may be formed by an elastically or plastically deformable widening and/or thickening of the circuit board. This can be formed both across the entire length of the circuit board and in a punctiform manner. Accordingly, a simple and cost-effective integration of the first clamping element into the circuit board may be realized.

The widening or thickening may be embodied as a lug or snap-fit hook. As a result, the circuit board may be held securely in the trench but can be dismounted again.

The circuit board may be fixed by three additional clamping elements. Accordingly, additional support is provided.

BRIEF DESCRIPTION OF THE DRAWINGS

FIG. 1 shows a sectional view of a holding apparatus with grooves on both sides, FIG. 2 shows a top view of the holding apparatus from FIG. 1, FIG. 3 shows a top view of a circuit board with lugs and recesses.

DETAILED DESCRIPTION

Figure 4:
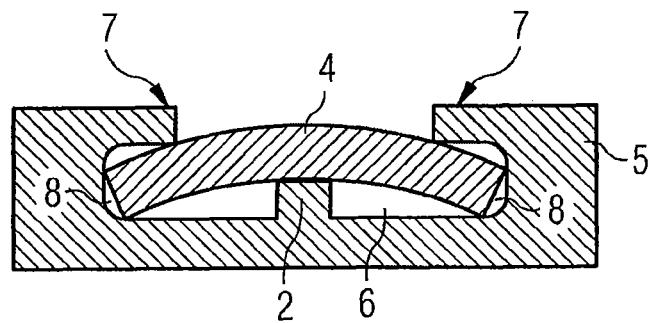
FIG. 4 shows a sectional view of a holding apparatus with a curved circuit board.

FIG. 1 shows a cross-section through a holding apparatus comprising a support element 5 and a circuit board 4. The circuit board 4 is arranged in a trench 6 of the support element 5. The trench 6 is delimited by two parallel longitudinal sides and/or side walls 7. Grooves 8 are formed in the two longitudinal sides 7. The circuit board 4 may be inserted in the grooves. Elastic and/or plastic first clamping elements 1 are molded onto the longitudinal sides of the circuit board 4. The circuit board 4 is fixed into the trench 6 in a clearance-free fashion by first clamping elements 1. The circuit board 4 is inserted into the grooves 8 in order to mount the circuit board 4 onto the support element 5. The first clamping elements 1 deform and the circuit board 4 in the trench 6 distorts. The first clamping elements 1 may be a component part of the circuit board 4. In other words, the first clamping elements 1 may be embodied in one piece.

FIG. 2 shows a top view of the holding apparatus in FIG. 1. The circuit board 4 is inserted into the two grooves 8 of the support element 5, which are arranged in parallel. The first clamping elements 1 are arranged at regular intervals in the form of widenings on both sides of the circuit board 4. The first clamping elements 1 are embodied in the form of narrow lugs 1, in order to minimize the friction during insertion of the circuit board 4 into the grooves 8 of the trench. The circuit board 4 may optionally also be thickened in a punctiform fashion in its edge regions, thereby fixing the circuit board 4 into the grooves 8. The first clamping elements 1 may only be arranged on one side.

Instead of using regular thickenings to clamp the circuit board 4 in the trench, the circuit board 4 may be fed into the trench with a relatively large amount of clearance using a one- or two-sided groove and can be fixed in a clearance-free fashion by laterally introducing a bonding, for example, silicone.

FIG. 3 shows a top view of a circuit board 4 with first clamping elements 1, which are formed in one piece from the material of the circuit board 4. Recesses 9 are arranged in the circuit board 4 behind the first clamping elements 1. As a result, a clamping force F may elastically deform the first clamping elements 1. The circuit board 4 may be elastically deformed by the clamping force F in the region of the first clamping elements 1. An optimum fit of the circuit board 4 in a trench of a support element is ensured.

In one embodiment, as shown in FIG. 4, a holding apparatus may include a support element 5 and a trench 6, which is formed by longitudinal sides 7 and grooves 8. Two clamping elements 2 are embodied in the form of elevated lugs on the base of the trench. The clamping elements 2 may be elastic or also rigid. A circuit board 4 is clamped by the grooves 8 and the second clamping elements 2, with the clamping force being produced by a curvature in the circuit board 4.

Figure 5:
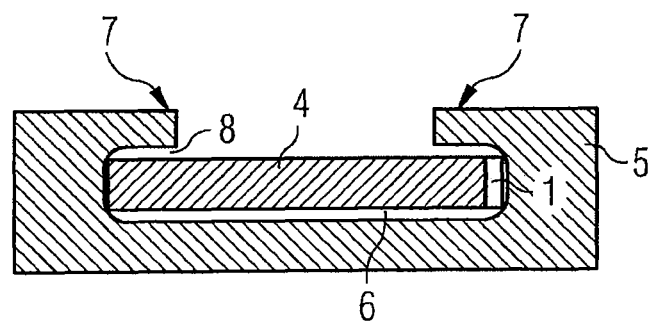
FIG. 5 shows a sectional view of a holding apparatus with a groove on one side.

FIG. 5 shows a cross section through a holding apparatus with a groove 8 on one side and first clamping elements 1 arranged opposite one another. The circuit board 4 may be easily fixed in the trench 6 of the support element 5 with one-dimensional curved support elements 5. A second groove 8 can be dispensed with as a result.

Figure 6:
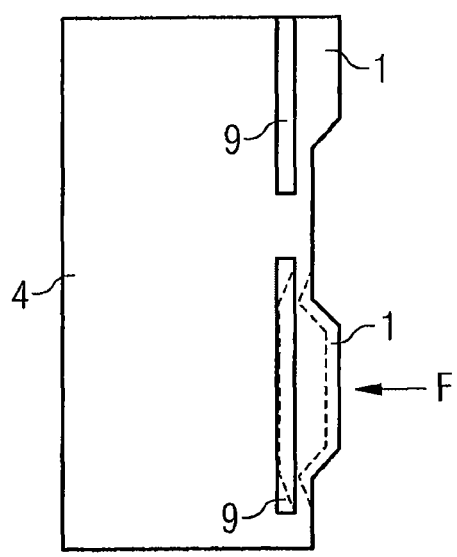
FIG. 6 shows a top view of a circuit board with a snap-fit hook.
Figure 7:
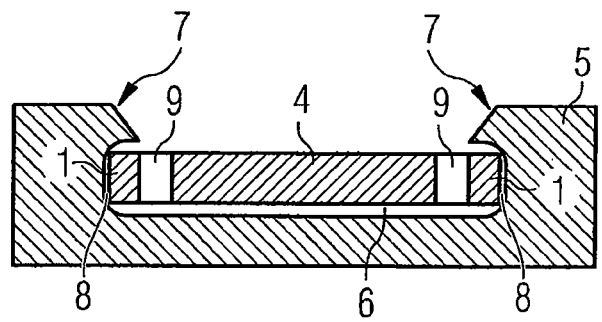
FIG. 7 shows a sectional view of the circuit board from FIG. 6.

FIGS. 6 and 7 show an embodiment of the holding apparatus, in which the circuit board 4 may be pressed into the trench 6 of a support element 5 from above. The first clamping elements 1 are embodied as snap-fit hooks. FIG. 6 shows a top view onto a circuit board 4 with snap-fit hooks 1. These are formed as widenings of the circuit board 4. Recesses 9 are arranged in the circuit board 4 behind the snap-fit hooks 1 in order to ensure the necessary elasticity. The snap-fit hook 1 may be compressed by a clamping force F. FIG. 7 shows the sectional view of the holding apparatus associated with FIG. 6. The circuit board 4 is fixed in the trench 6 of the support element 5 by snap-fit hooks 1 and recesses 9 arranged on both sides. The side walls 7, which form the trench 6, are provided with grooves 8. The side walls of the longitudinal sides 7 are beveled for a simpler snap-fit connection of the circuit board 4 into the grooves 8 of the trench 6. The circuit board 4 may be easily pressed into the trench 6 from above.

Figure 8:
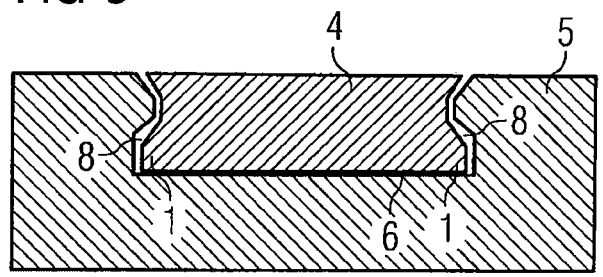
FIG. 8 shows a sectional view of a holding apparatus with an undercut.

FIG. 8 shows a sectional view of one embodiment of the holding apparatus, in which no specially shaped snap-fit hooks are needed in the case of a corresponding elasticity of the circuit board 4 or of the trench 6. The first clamping elements 1 can be formed, for example, by a widening of the circuit board 4 across the entire length. The circuit board 4 is in turn pressed into the trench 6 of the support element 5 from above and is then held in the grooves 8.

Figure 9:
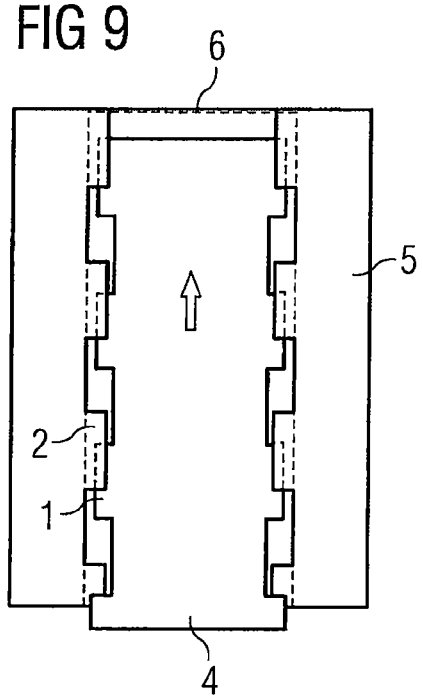
FIG. 9 shows a top view of a holding apparatus with taperings of the trench and widenings of the circuit board.

FIG. 9 shows the top view onto a holding apparatus including a circuit board 4 with first clamping elements 1 and a support element 5 with second clamping elements 2 and a trench 6, which can receive the circuit board 4. The second clamping elements 2 form an interrupted groove. A break is at least as long as the first clamping element 1. As a result, the circuit board 1 may be easily inserted into the support element 5 from above. The first clamping elements 1 may be moved to below the second clamping elements 2 in the direction of the arrow, as a result of which the circuit board 4 is fixed in the trench of the support element 5.

Figure 10:
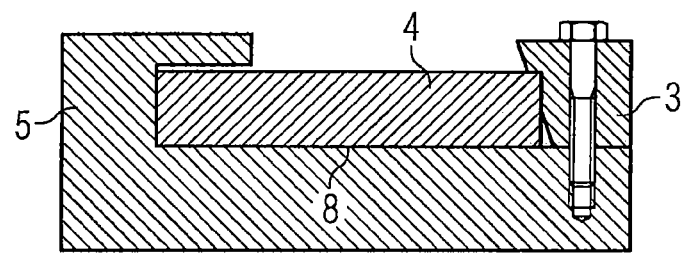
FIG. 10 shows a sectional view of a holding apparatus with three clamping elements.
Figure 11:
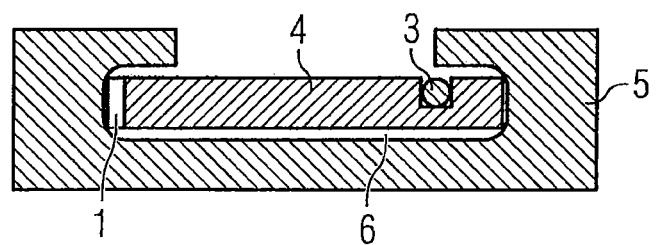
FIG. 11 shows a sectional view of a further holding apparatus with three clamping elements.
Figure 12:
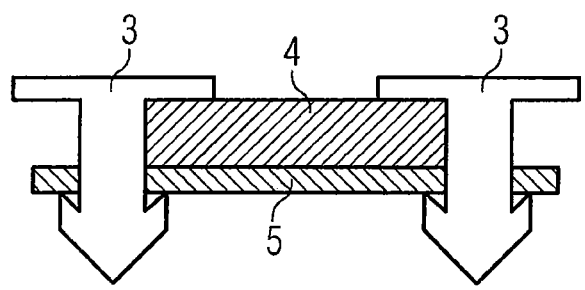
FIG. 12 shows a sectional view of a further holding apparatus with three clamping elements.

FIGS. 10 to 12 show embodiments in which the circuit board 4 is fixed on the support element 5 using three clamping elements 3, exclusively or in addition to first and second clamping elements 1, 2. FIG. 10 shows a cross-section through a holding apparatus with a circuit board 4, which is guided into a groove 8 on the one side. One of the three clamping elements 3, for example, a screw with a clamping wedge, fixes the circuit board 4 on the support element 5. The clamping force may act both in the transverse direction and also in the normal direction with respect of the circuit board 4. FIG. 11 shows a sectional view of a circuit board 4 with first clamping elements 1, which is introduced into a trench 6 of a support element 5. The circuit board 4 is fixed by a tensioning element 3, for example, a strap, a fiber, or a wire. The tensioning element 3 can be inserted into a groove of the circuit board 4. FIG. 12 shows an arrangement in which third clamping elements 3 in the form of limiting elements are arranged on both sides and fix the circuit board 4 to the support element 5.

The third clamping elements 3 may be fastened by clips, screws, rivets or bonding.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A holding apparatus comprising: a circuit board comprising a top, a bottom, and at least two outer perimeter sides, the top and the bottom each having a greater area than each of the at least two outer perimeter sides, the at least two outer perimeter sides being outermost in relation to a central axis along the length of the circuit board; and a support element having a trench for receiving the circuit board formed in or on the support element, the trench including longitudinal sides and a bottom, the bottom extending from a first of the longitudinal sides to a second of the longitudinal sides, wherein at least one first clamping element is arranged on one or both longitudinal sides of the circuit board and at least one second clamping element is arranged in the trench, as a result of which the circuit board received by the trench is fixed in the trench in a clearance-free fashion, wherein each of the longitudinal sides of the trench includes a groove, the circuit board having a shape that fits in the grooves, wherein the grooves at least partially enclose at least one of the at least two outer perimeter sides of the printed circuit board, wherein the at least one second clamping element includes an elastically or plastically deformable tapering of the trench and a bevel of the longitudinal sides of the trench, and wherein the at least one first clamping element is formed by an elastically or plastically deformable, continuous or punctiform widening, thickening, or widening and thickening of the circuit board.

2. The holding apparatus as claimed in claim 1, wherein the longitudinal sides of the trench include the at least one second clamping element.

3. The holding apparatus as claimed in claim 1, wherein the tapering is a lug or snap-fit hook.

4. The holding apparatus as claimed in claim 1, wherein the widening or thickening includes a lug or snap-fit hook.

5. The holding apparatus as claimed in claim 1, wherein the circuit board and the at least one first clamping element are configured as a single part.

6. The holding apparatus as claimed in claim 1, wherein the length of the groove is at least half the length of the circuit board.

7. The holding apparatus as claimed in claim 1, wherein the entire width of the circuit board is disposed in the trench.

8. A computed tomography system comprising: a circuit board comprising a top, a bottom, and at least two outer perimeter sides, the top and the bottom each having a greater area than each of the at least two outer perimeter sides, the at least two outer perimeter sides being outermost in relation to a central axis along the length of the circuit board; and a holding apparatus having a support element, the support element having a trench for receiving the circuit board formed in or on the support element, the trench including longitudinal sides and a bottom, the bottom extending from a first of the longitudinal sides to a second of the longitudinal sides, wherein at least one first clamping element is arranged on one or both of the longitudinal sides of the circuit board, and at least one second clamping element is arranged in the trench, as a result of which the circuit board received by the trench is fixed in the trench in a clearance-free fashion, wherein each of the longitudinal sides of the trench includes a groove, the circuit board having a shape that fits in the grooves, wherein the grooves at least partially enclose at least one of the at least two outer perimeter sides of the printed circuit board, wherein the at least one second clamping element includes an elastically or plastically deformable tapering of the trench and a bevel of the longitudinal sides of the trench, and wherein the at least one first clamping element is formed by an elastically or plastically deformable, continuous or punctiform widening, thickening, or widening and thickening of the circuit board.

9. The computed tomography system as claimed in claim 8, wherein the longitudinal sides of the trench include the at least one second clamping element.

10. The computed tomography system as claimed in claim 8, wherein the tapering is a lug or snap-fit hook.

* * * * *